(12) United States Patent
Howard

(10) Patent No.: US 6,420,259 B1
(45) Date of Patent: *Jul. 16, 2002

(54) FORMATION OF A SELF-ALIGNED STRUCTURE

(75) Inventor: Bradley J. Howard, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/634,075

(22) Filed: Aug. 8, 2000

Related U.S. Application Data

(63) Continuation of application No. 09/218,791, filed on Dec. 21, 1998, now Pat. No. 6,100,180, which is a continuation of application No. 08/552,824, filed on Nov. 3, 1995, now Pat. No. 5,851,926.

(51) Int. Cl.⁷ .......................................... H01L 21/4763
(52) U.S. Cl. ..................... 438/626; 438/631; 438/633; 438/634
(58) Field of Search ................................ 438/622, 626, 438/631, 633, 634

(56) References Cited

U.S. PATENT DOCUMENTS

| | | | |
|---|---|---|---|
| 4,944,682 A | 7/1990 | Cronin et al. | 438/595 |
| 5,229,326 A | 7/1993 | Dennison et al. | 438/633 |
| 5,296,400 A | 3/1994 | Park et al. | 438/586 |
| 5,851,916 A | * 12/1998 | Howard | 438/626 |
| 6,010,947 A | 1/2000 | Kondo | 438/435 |
| 6,087,250 A | * 7/2000 | Hyakutake | 438/598 |
| 6,100,180 A | 8/2000 | Howard | 438/626 |
| 6,124,200 A | * 9/2000 | Wang et al. | 438/624 |
| 6,133,139 A | * 10/2000 | Dalal et al. | 438/624 |
| 6,128,284 A1 | * 4/2001 | Liu et al. | 438/624 |

* cited by examiner

Primary Examiner—T. N. Quach
(74) Attorney, Agent, or Firm—Workman, Nydegger & Seeley

(57) ABSTRACT

A improved method is provided for forming self-aligned integrated circuit structures, particularly self-aligned contact structures, by providing, on a substrate, raised structures each including an outermost protective layer, and each having a horizontal upper surface extending between substantially vertical lateral surfaces, said horizontal upper surface being horizontal over the entire area therebetween. An etchable layer is formed over and between said raised structures. A photoresist layer is formed on said etchable layer and patterned. Said etchable layer is then anisotropically etched selective to said protective layer to remove said etchable layer from between selected of said raised structures, said horizontal upper surfaces substantially preventing etching at top outer edges of said raised structures and preserving thereby the integrity of the protective layers. A fill layer is then formed or deposited to fill between said selected of said raised structures, forming thereat structures that are self-aligned to said selected of said raised structures.

31 Claims, 7 Drawing Sheets

FORMATION OF A SELF-ALIGNED STRUCTURE

RELATED APPLICATIONS

This is a continuation of U.S. patent application Ser. No. 09/218,791, filed on Dec. 21, 1998, now U.S. Pat. No. 6,100,180, which is a continuation of U.S. patent application Ser. No. 08/552,824, filed on Nov. 3, 1995, now U.S. Pat. No. 5,851,916, which are incorporated herein by reference.

BACKGROUND OF THE INVENTION

1. The Field of the Invention

The present invention relates to semiconductor devices and the manufacture thereof. More particularly, the present invention is directed to a method for forming self-aligned integrated circuit structures employing a protective layer having a horizontal top surface.

2. The Relevant Technology

Self-aligned structures in an integrated circuit may be formed by shielding previously formed structures with a protective layer of a material that resists the etchant which is used to form spaces for the self-aligned structures. The protective layer shields underlying previously formed structures from the etchant, effectively preventing the etchant from etching away around the structures to be protected. Thus the alignment of the mask to the previously formed structures is much less critical, hence the name "self-aligned". Such self-aligned structures allow denser spacing of circuit devices.

For successful formation of self-aligned structures such as self-aligned contact structures, the protective layer must adequately withstand the etchant which forms the spaces in which the self-aligned structures are to be formed. If a protective layer is etched through in the case of self-aligned contacts for example, the contact structures formed subsequently will contact inappropriate areas, resulting in shorted, non-functional circuit devices.

Protective layers over underlying structures are most vulnerable at top edges of the protective layer. Reducing the protective layer's tendency to be etched through at such top edges would thus provide an important advantage, allowing the production of dense self-aligned circuit designs with increased process control and higher yield.

SUMMARY AND OBJECTS OF THE INVENTION

An object of the present invention is to provide an improved method for forming self-aligned integrated circuit structures, said method providing decreased likelihood of etch-through of a protective layer overlying the circuit structures.

Another object of the present invention is to provide an improved method for forming self-aligned integrated circuit structures, said method allowing the production of dense self-aligned circuit designs with increased process control and higher yield.

Another object of the present invention is to provide processes for forming on a substrate a raised structure including an outermost protective layer, said structure having a horizontal upper surface extending between substantially vertical lateral surfaces, said horizontal upward surface being horizontal over the entire area therebetween.

In accordance with the method of the present invention, raised structures each have thereon a vertical protective layer on lateral sides of the raised structure. The surface of the protective layer forms a vertical lateral surface over the raised structure. Each raised structure is provided with a horizontal upper surface extending between the vertical lateral surface. The horizontal upper surface is substantially horizontal over the entire area between the vertical lateral surface which circumscribes the horizontal upper surface. An etchable layer is provided over and between two or more of the raised structures, and a patterned photoresist layer is provided on the etchable layer.

The etchable layer is then etched anisotropically and selectively to the protective layer to form spaces between the raised structures. A fill layer is then deposited to fill the spaces between the raised structures. The material of the fill layer in the spaces is self-aligned to the raised structures. During the anisotropic etch of the etchable layer, the horizontal upper surface of the protective layer of each raised structure provides significantly improved resistance to, or selectivity of, etching at the top edges of the raised structure where the horizontal upper surface meets the vertical lateral surface. By forming a horizontal upper surface of the protective layer, there is an increase in process reliability, control, and yield.

Various planarization processes may be employed to form the horizontal upper surface of the protective layer of the raised structures, including chemical mechanical polishing and simultaneous etching.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

While the present invention will be described in detail with particular reference to self-aligned contact structures, the present invention is applicable to virtually any type of self-aligned integrated circuit structure, as will be appreciated by those of skill in the art.

Figure 1:
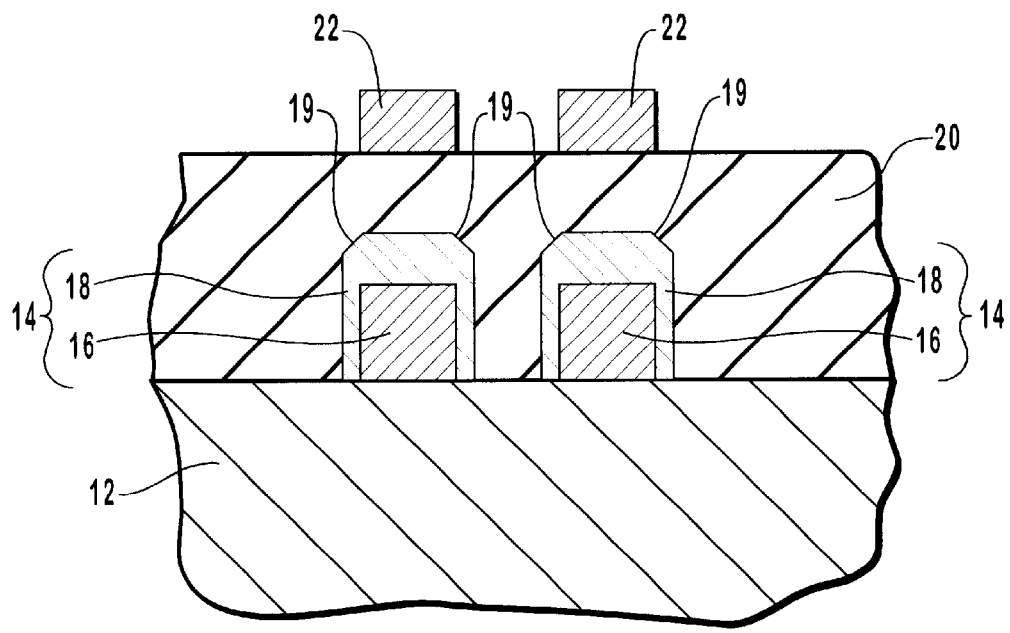
FIG. 1 is a partial cross section of a partially formed integrated circuit according to typical processing.
Figure 2:
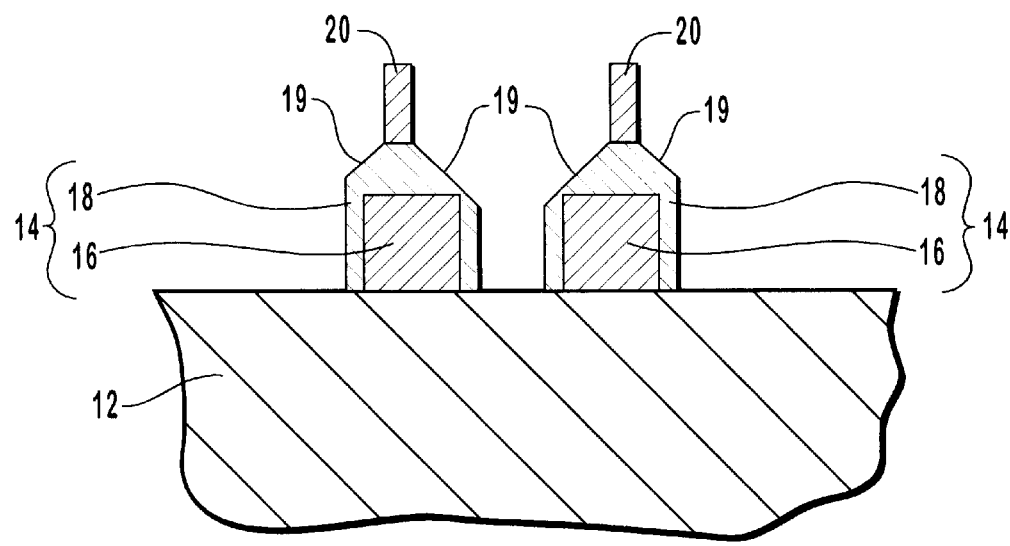
FIG. 2 is the cross section of FIG. 1 after further typical processing.
Figure 3:
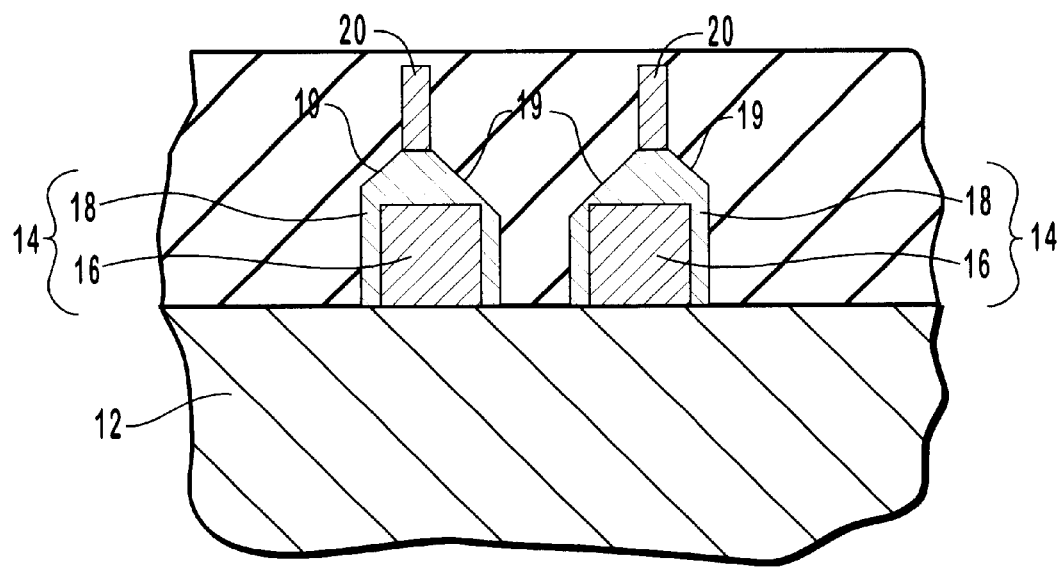
FIG. 3 is the cross section of FIG. 2 after further typical processing.

FIGS. 1–3 illustrate the typical process for forming self-aligned structures.

FIG. 1 is a partial cross section of a partially formed integrated circuit. Raised structures 14 which include underlying structures 16 and protective layers 18 have been formed on a substrate 12. Protective layers 18 have diagonal facets 19 at the top edges thereof An etchable layer 20 has been deposited over and between raised structures 14, and a photoresist layer 22 has been deposited and patterned upon etchable layer 20.

FIG. 2 is the cross section of FIG. 1 after an anisotropic etch of etchable layer 20 and removal of photoresist layer 22. The anisotropic etch is intended to be selective to protective layers 18, i.e., to not etch protective layers 18, but the top edges of protective layers 18 are etched somewhat nonetheless. Facets 19 have thus been enlarged. The etching of protective layers 18 is not easily controlled, and can result in a breach thereof as seen at breach location 29.

FIG. 3 is the cross section of FIG. 2 after a fill layer 28 has been deposited thereover. If fill layer 28 is a contact plug fill and underlying structures 16 are gate or wordline stacks, for example, then the plug fill will contact the gate stack or wordline stack at breach location 29, resulting in a shorted, non-functional device.

While the physical and/or chemical mechanisms therefor have not been fully ascertained, it has been found that the etching of protective layer 18 at the top edges thereof illustrated in FIGS. 1–3 can be substantially reduced or eliminated by providing protective layer 18 with a horizontal upper surface which extends horizontally between the vertical lateral surfaces of protective layer 18 without any intervening diagonal facets 19 at the junction of these surfaces.

Figure 4:
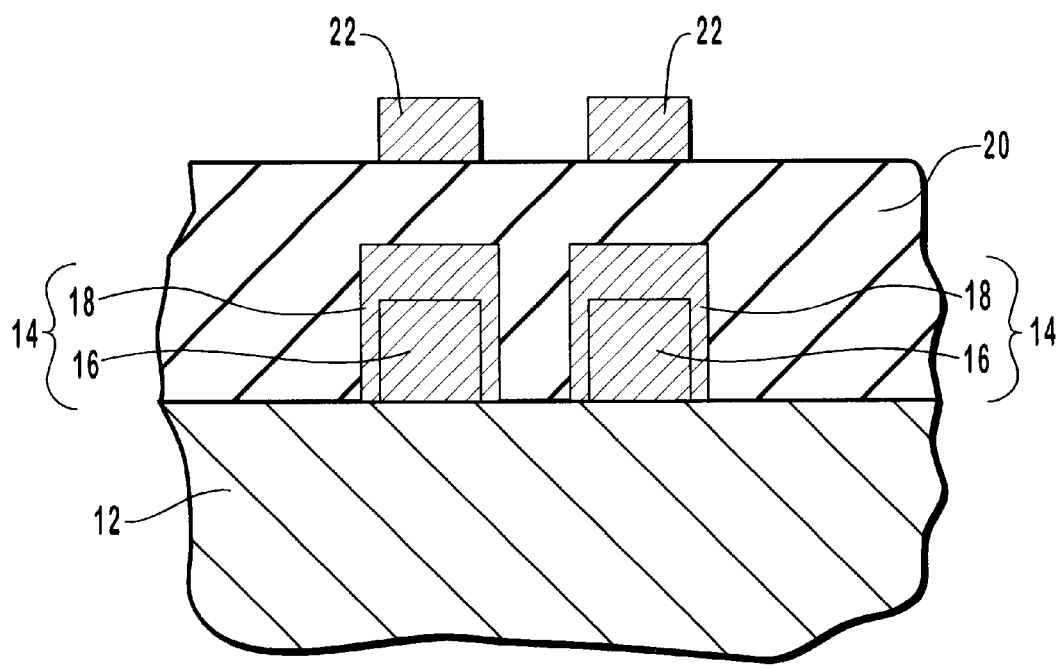
FIG. 4 is a partial cross section of a partially formed integrated circuit according to the method of the present invention.

Accordingly, in the method of the present invention, raised structures 14, each including an underlying structure 16 and a protective layer 18, are formed on a substrate 12 as shown in FIG. 4. Raised structures 14 are each provided with a horizontal upper surface 24 extending between substantially vertical lateral surfaces 26, surface 24 being horizontal over the entire area therebetween. Thus no facets are present at the top edges of protective layers 18 of raised structures 14. An etchable layer 20 has been deposited over substrate 12 and over and between raised structures 14. A photoresist layer 22 has been deposited on etchable layer 20, which etchable layer 22 is then patterned.

Figure 5:
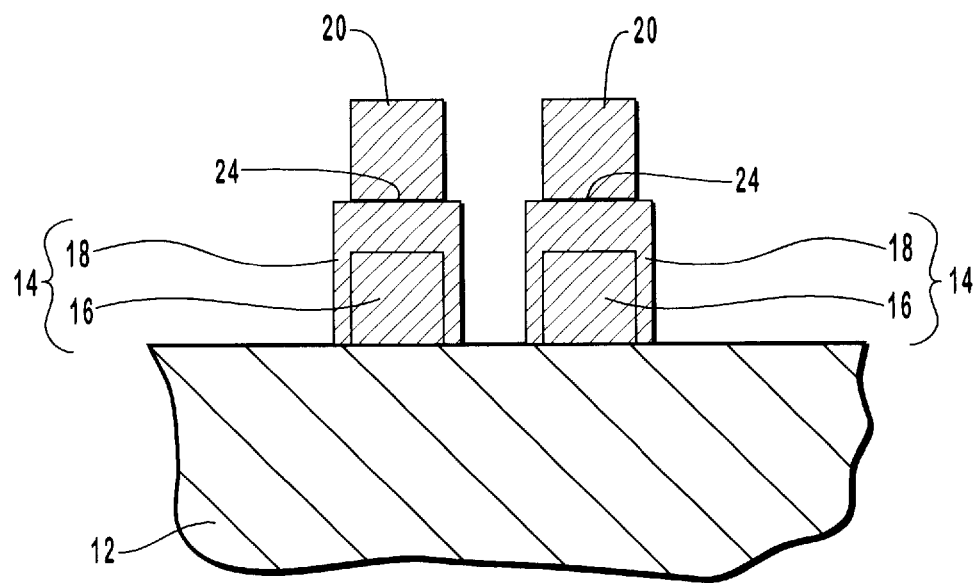
FIG. 5 is the cross section of FIG. 4 after an etch step.

FIG. 5 is the cross section of FIG. 4 after an anisotropic etch of etchable layer 20 selective to protective layer 18, and after removal of photoresist layer 22. Horizontal upper surface 24 has prevented any substantial etching of protective layer 18 at the top edges thereof.

Figure 6:
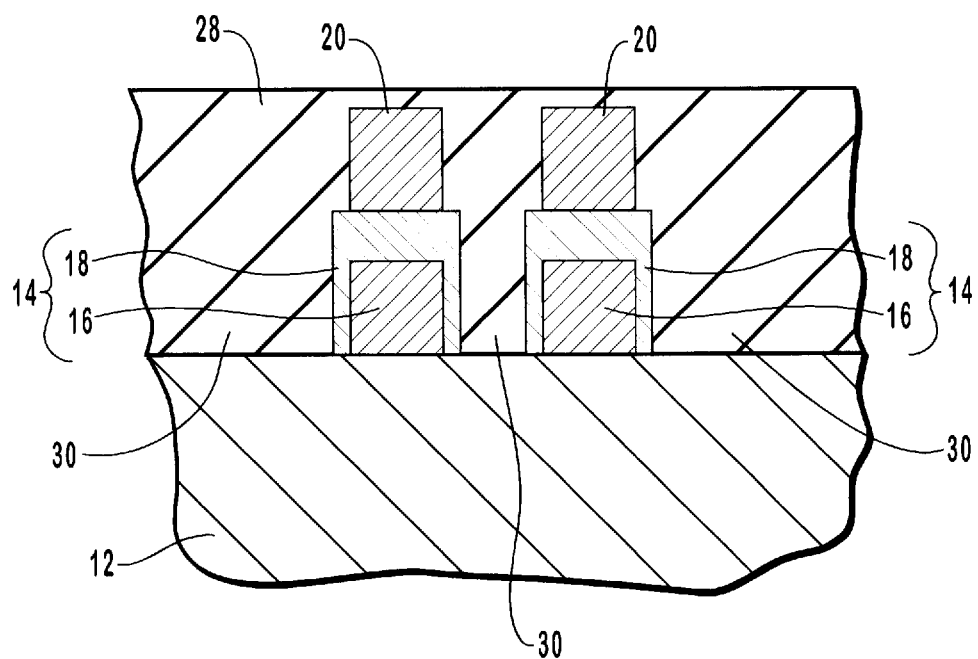
FIG. 6 is the cross section of FIG. 5 after a deposition step.
Figure 7:
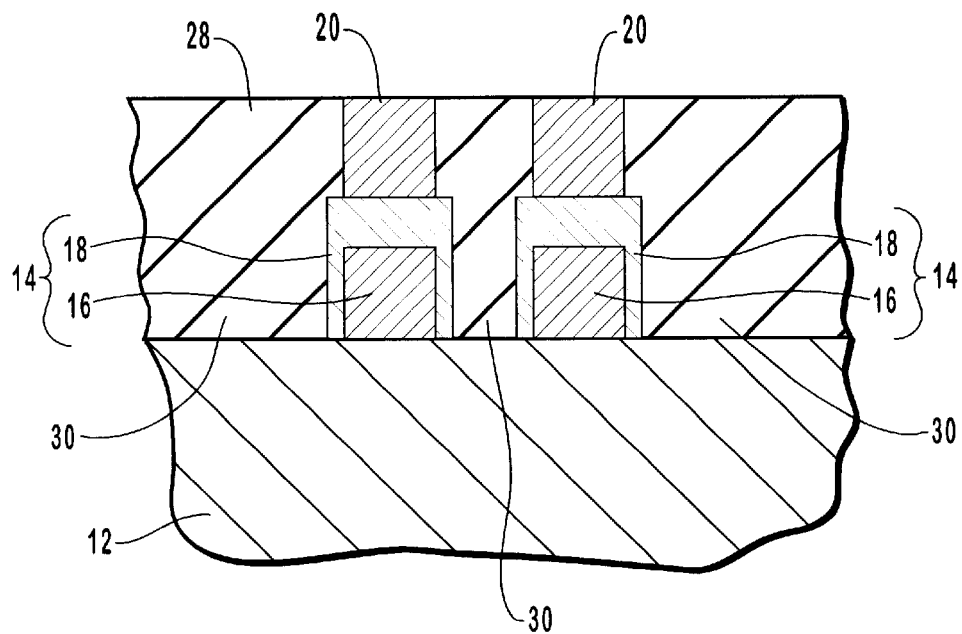
FIG. 7 is the cross section of FIG. 6 after a removal step.

FIG. 6 is the cross section of FIG. 5 after deposition of a fill layer 28. Fill layer 28 will be used to form self-aligned structures 30 which are self-aligned to structures 16. Individual self-aligned structures may then be made separate and isolated one from another by removing the materials on substrate 12 from the top down at least as far as the top of etchable layer 20, resulting in self-aligned structures 30 shown in FIG. 7.

In application of the present invention to the formation of self-aligned contact structures, underlying structures 16 are gate or wordline stacks. Protective layer 18 is preferably silicon nitride, and etchable layer 20 is preferably borophosphorous silica glass (BPSG). The absence of facets at the top edges of nitride protective layer 18 substantially improves the selectivity or resistance thereof to standard anisotropic nitride-selective BPSG etches, resulting in better process control and higher yields in a dense self-aligned integrated circuit design.

While protective layer 18 is preferably silicon nitride for formation of self-aligned contact structures, other materials such as polysilicon or an oxide of silicon may be used to form self-aligned structures according to the method of the present invention.

In the process of the present invention described above with reference to FIGS. 4–7, raised structures 14 each having horizontal upper surface 24 may be provided by any suitable planarization process. Presently preferred methods for providing this feature are illustrated below with reference to FIGS. 8–14.

Figure 8:
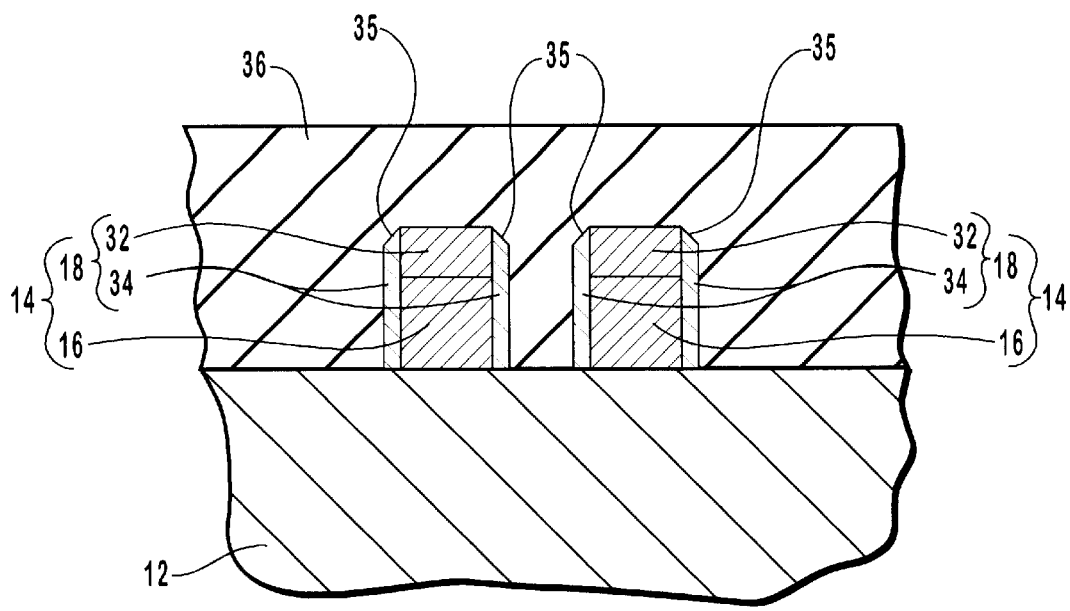
FIG. 8 is a partial cross section of a partially formed integrated circuit according to certain processes of the present invention for providing the structure shown in FIG. 4.

FIG. 8 is a partial cross section of a partially formed integrated circuit. Objects which each include a desired underlying structure 16 and a top layer 32 of a protective material have been formed on substrate 12. Spacers 34 of the same protective material were then formed by deposition and an anisotropic etch, which process results in a facet 35 at the top outside facing edge of each spacer 34. Each top layer 32 together with its associated spacers 34 forms a protective layer 18. The entirety of each underlying structure 16 and its associated protective layer 18 constitutes a raised structure 14. A first layer 36 of an etchable material has been deposited between and over raised structures 14.

Figure 9:
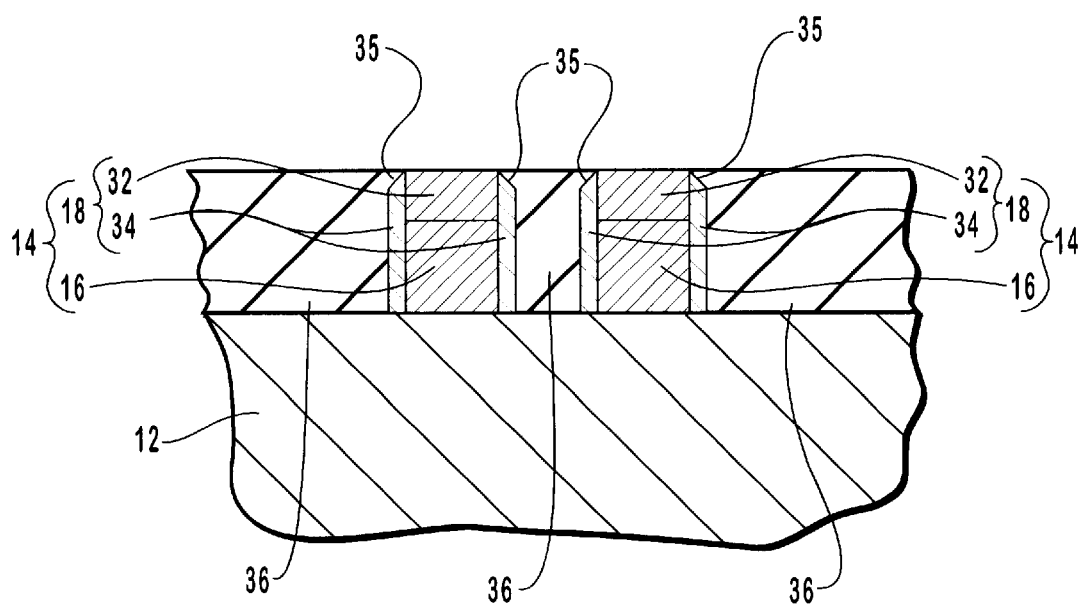
FIG. 9 is the cross section of FIG. 8 after a chemical mechanical polishing step.
Figure 10:
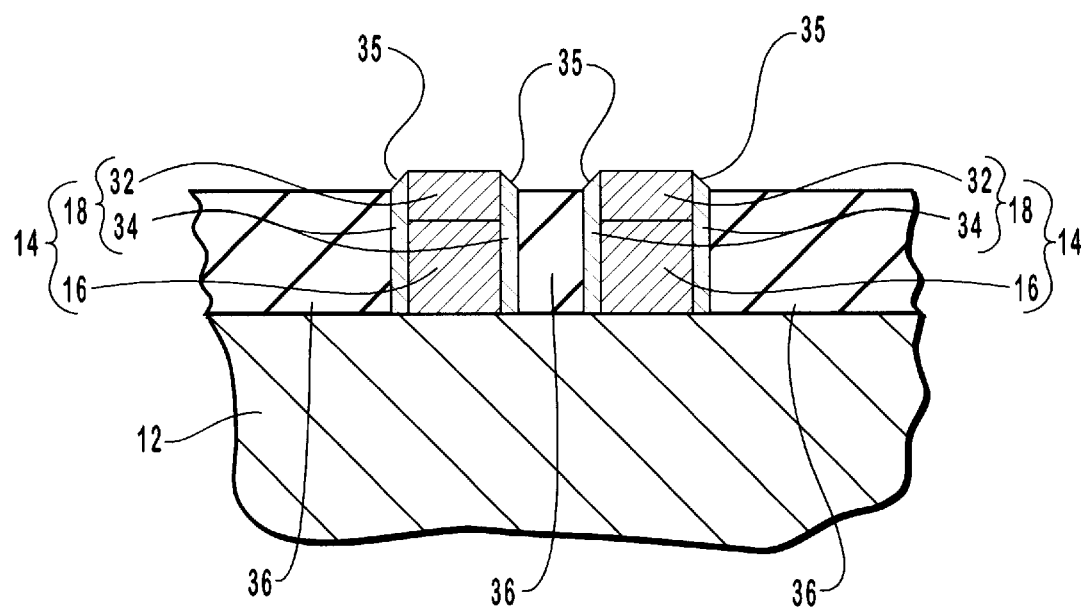
FIG. 10 is the cross section of FIG. 9 after an etch step.
Figure 11:
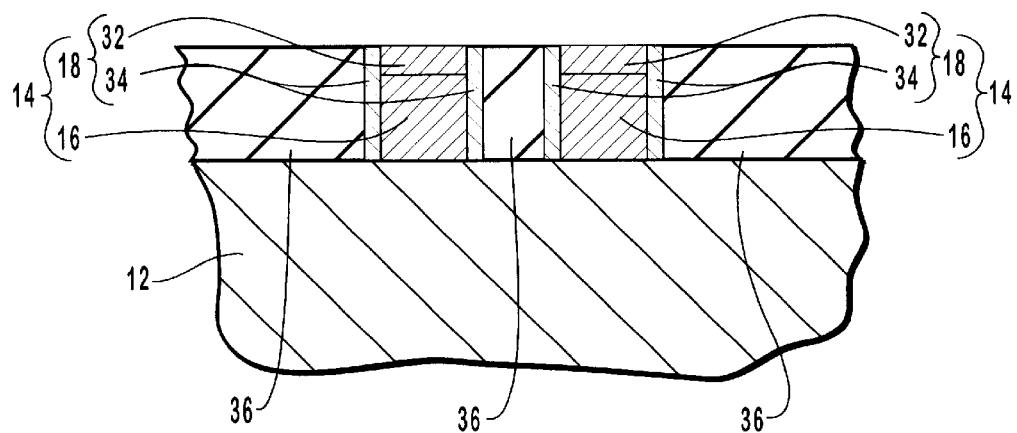
FIG. 11 is the cross section of FIG. 10 after chemical mechanical polishing step according to one process of the present invention for providing the structure shown in FIG. 4, the cross section of FIG. 13 (described below) after a chemical mechanical polishing step according to another process of the present invention for providing the structure shown in FIG. 4, and the cross section of FIG. 9 after a simultaneous etch step according to yet another process of the present invention for providing the structure shown in FIG. 4.
Figure 12:
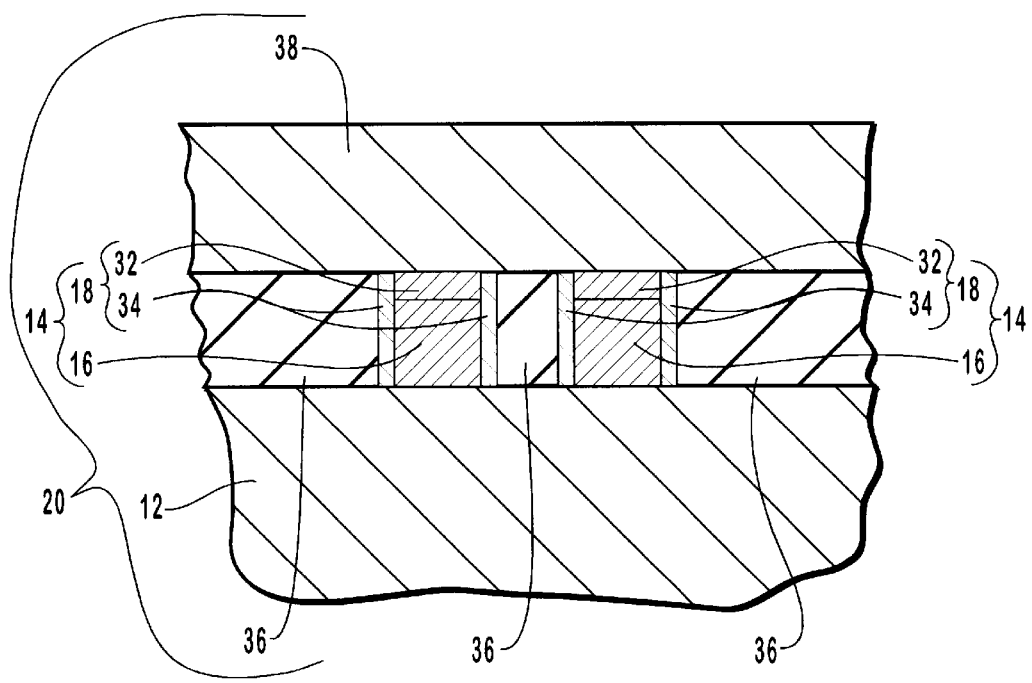
FIG. 12 is the cross section of FIG. 11 after a deposition step, resulting in structure corresponding to the structure of FIG. 4.

According to one presently preferred process for providing raised structures 14 each having a horizontal upper surface, first layer 36 shown in FIG. 8 is removed by chemical mechanical polishing (CMP) down to the top of top layers 32, resulting in the structure shown in FIG. 9. First layer 36 is then etched back to below the lowest extent of facets 35, as shown in FIG. 10. The upwardly protruding portions of top layers 32 and spacers 34 are then removed by CMP, resulting in the structure shown in FIG. 11. A second layer 38 of the same etchable material is then deposited over first layer 36 and raised structures 14, resulting in the structure shown in FIG. 12. First and second layers 36, 38 of the etchable material together form etchable layer 20. Processing may then proceed as described above in relation to FIGS. 4–7.

In application of the above process seen in FIGS. 8–12 to the formation of self-aligned contact structures, the protective material is nitride, the etchable material is BPSG, and the first layer of BPSG is deposited and reflowed to form a planar upper surface. The CMP of the first layer is a nitride-selective CMP, such that the CMP inherently stops on the top of top layers 32. First layer 36 is etched back by an appropriately timed HF dip. A nitride CMP is then used to remove the protruding portions of top layers 32 and spacers 34.

Figure 13:
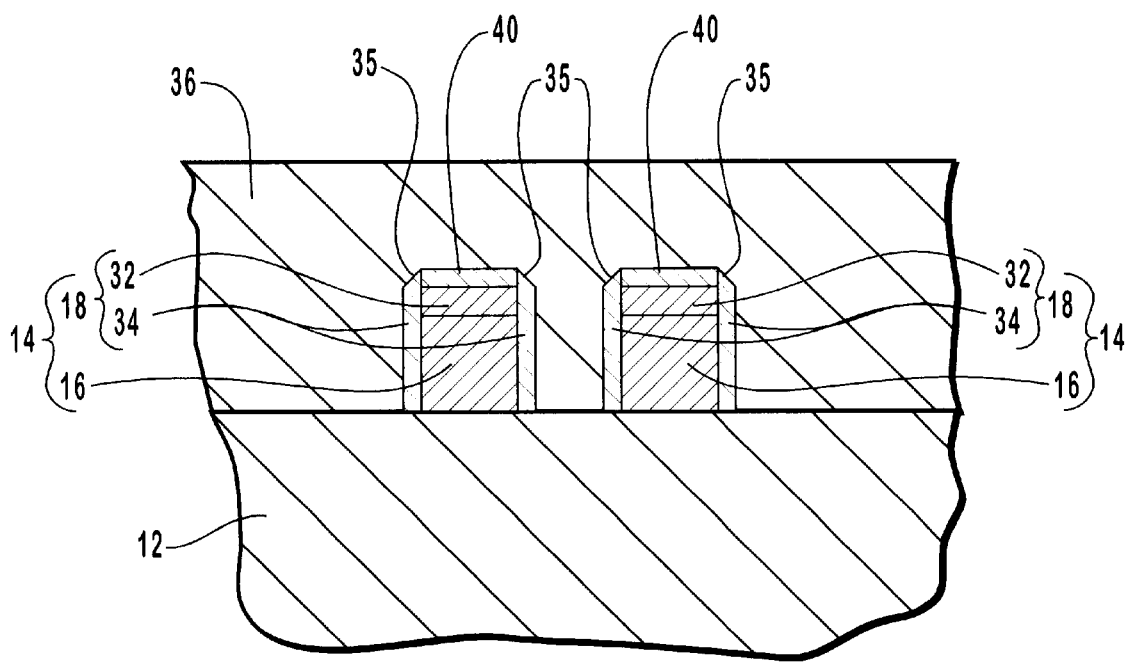
FIG. 13 is a partial cross section of a partially formed integrated circuit according to a process of the present invention for providing the structure shown in FIG. 4.

In another presently preferred process for providing raised structures 14 each having a horizontal upper surface, objects which each include a desired underlying structure 16 and a top layer 32 of a protective material with a cap 40 thereon have been formed on a substrate 12, as shown in FIG. 13. Spacers of like protective material are then formed by deposition and an anisotropic etch, which process results in spacers 34 with a facet 35 at the top outside facing edge of each. Each top layer 32 together with its associated spacers 34 forms a protective layer 18. The entirety of each underlying structure 16 and its associated protective layer 18 constitutes a raised structure 14. A first layer 36 of an etchable material is deposited between and over raised structures 14. CMP is then used to remove all materials on substrate 12 from the top downward to the top surface of top layers 32. This is preferably achieved by a CMP selective to the protective material of which top layers 32 and spacers 34 are formed. Caps 40 are removed by the chemical and mechanical action of the CMP. The thin portions of spacers 34 which extend above the top surfaces of top layers 32 are removed by the mechanical action of the CMP, resulting in the structure shown in FIG. 11. A second layer 38 of the same etchable material is then deposited over the structure of FIG. 11, resulting in the structure shown in FIG. 12. Processing may then proceed as described above in relation to FIGS. 4–7.

In application of the above process to the formation of self-aligned contact structures, the protective material is preferably silicon nitride, the etchable material is preferably BPSG, and the cap is preferably an oxide of silicon. The first layer of BPSG is deposited and reflowed to form a planar upper surface.

According yet another presently preferred process for providing raised structures 14 each having a horizontal upper surface, first layer 36 shown in FIG. 8 is removed by chemical mechanical polishing (CMP) down to the top of top layers 32, resulting in the structure shown in FIG. 9. First layer 36 is then etched back simultaneously with top layer 32 and spacers 34 to below the lowest extent of facets 35, resulting directly in the structure shown in FIG. 11. A second layer 38 of the same etchable material is then deposited over first layer 36 and raised structures 14 resulting in the structure shown in FIG. 12. Processing may then proceed as described above in relation to FIGS. 4–7.

In a presently preferred application of the above process to the formation of self-aligned contact structures, the protective material is nitride, and the etchable material is BPSG. The first layer 36 of BPSG is deposited and then reflowed to form a planar upper surface. The CMP of the first layer is a nitride-selective CMP, such that the CMP inherently stops on the top of top layers 32. First layer 36, top layers 32, and spacers 34 are simultaneously etched back by a dry etch including a mixture of $CF_4$ and $CHF_3$.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of making a self-aligned interconnect between and in contact with a pair of raised structures on a substrate that are enclosed in an electrical insulation layer, each said raised structure being enclosed and electrically isolated above the substrate by an enclosure, each said enclosure having a planar top surface intersecting and being perpendicular to opposing lateral sidewalls of said enclosure, the method comprising:

forming a layer of a masking material over the electrical insulation layer;

patterning the layer of the masking material to form, vertically aligned with and above each said raised structure, a portion of the layer of the masking material;

exposing the substrate between the pair of raised structures by removing the electrical insulation layer between the pair of raised structures while leaving a portion of the electrical insulation layer upon each said enclosure;

removing the masking material upon each said portion of the electrical insulation layer upon each said enclosure;

forming an electrically conductive fill layer upon the substrate between each said portion of the electrical insulation layer upon each said enclosure; and removing a portion of the electrically conductive fill layer to form said self-aligned interconnect that is in contact with:
each said portion of the electrical insulation layer upon each said enclosure; and
each said enclosure on each said raised structure.

2. The method as defined in claim 1, wherein exposing the substrate between the pair of raised structures is an anisotropic etch process.

3. The method as defined in claim 1, further comprising planarizing the electrically conductive fill layer in a chemical mechanical polishing process.

4. The method as defined in claim 1, wherein:
the electrical insulation layer is composed of a first dielectric material;
each said enclosure is composed of a second dielectric material; and
the first dielectric material is different than the second dielectric material.

5. The method as defined in claim 1, wherein:
forming the electrically conductive fill layer further comprises forming said electrically conductive fill layer upon each said portion of the electrical insulation layer upon each said enclosure; and
removing a portion of the fill layer to form said self-aligned interconnect further comprises forming a planar top surface upon each said portion of the electrical insulation layer upon each said enclosure, said planar top surface being coplanar with a top surface on the self-aligned interconnect.

6. The method as defined in claim 1, wherein exposing the substrate between the pair of raised structures by removing the electrical insulation layer between the pair of raised structures while leaving said portion of the electrical insulation layer upon each said enclosure further comprises forming a planar top surface on each said portion of the electrical insulation layer upon each said enclosure.

7. The method as defined in claim 1, wherein each said enclosure is composed of a dielectric material and has an upper surface intersecting opposing facets, each said facet intersecting a lateral surface on the raised structure, each said lateral surface projecting towards the substrate.

8. The method as defined in claim 1, wherein said self-aligned interconnect is electrically isolated above the substrate by:
   each said portion of the electrical insulation layer upon each said enclosure; and
   each said enclosure on each said raised structure.

9. A method of making a self-aligned contact plug between and in contact with a pair of gate stacks on a semiconductor substrate that are enclosed in an electrical insulation layer, each said gate stack being enclosed and electrically isolated above the semiconductor substrate by a spacer, each said spacer having a planar top surface intersecting and being perpendicular to opposing lateral sidewalls of said spacer, the method comprising:
   forming a layer of a masking material over the electrical insulation layer;
   patterning the layer of the masking material to form, vertically aligned with and above each said gate stack, a portion of the layer of the masking material;
   exposing the semiconductor substrate between the pair of gate stacks by removing the electrical insulation layer between the pair of gate stacks while leaving a portion of the electrical insulation layer upon each said spacer;
   removing the masking material upon each said portion of the electrical insulation layer upon each said spacer;
   forming an electrically conductive fill layer upon the semiconductor substrate between each said portion of the electrical insulation layer upon each said spacer; and
   planarizing the electrically conductive fill layer to form said self-aligned contact plug that is in contact with:
      each said portion of the electrical insulation layer upon each said spacer; and
      each said spacer on each said gate stack.

10. The method as defined in claim 9, wherein exposing the semiconductor substrate between the pair of gate stacks is an anisotropic etch process.

11. The method as defined in claim 9, wherein planarizing the electrically conductive fill layer is a chemical mechanical polishing process.

12. The method as defined in claim 9, wherein:
   the electrical insulation layer is composed of a first dielectric material;
   each said spacer is composed of a second dielectric material; and
   the first dielectric material is different than the second dielectric material.

13. The method as defined in claim 9, wherein:
   forming the electrically conductive fill layer further comprises forming said electrically conductive fill layer upon each said portion of the electrical insulation layer upon each said spacer; and
   planarizing the fill layer to form said self-aligned contact plug further comprises forming a planar top surface upon each said portion of the electrical insulation layer upon each said spacer, said planar top surface being co-planar with a top surface on the self-aligned contact plug.

14. The method as defined in claim 9, wherein exposing the semiconductor substrate between the pair of gate stacks by removing the electrical insulation layer between the pair of gate stacks while leaving said portion of the electrical insulation layer upon each said spacer further comprises forming a planar top surface on each said portion of the electrical insulation layer upon each said spacer.

15. The method as defined in claim 9, wherein each said spacer is composed of a dielectric material and has an upper surface intersecting opposing facets, each said facet intersecting a lateral surface on the gate stack, each said lateral surface projecting towards the semiconductor substrate.

16. A method of making a self-aligned contact plug between and in contact with a pair of gate stacks on a semiconductor substrate that are enclosed in an electrical insulation layer, each said gate stack being enclosed and electrically isolated above the semiconductor substrate by a faceted spacer, the method comprising:
   planarizing the electrical insulation layer and each said spacer above the facets;
   exposing each said facet by removing the electrical insulation layer;
   forming, by removing each said facet, a contiguous planar surface upon both the electrical insulation layer and each said gate stack;
   forming a dielectric layer upon the contiguous planar surface on the gate stacks and the electrical insulation layer;
   exposing the semiconductor substrate between the pair of gate stacks by removing the electrical insulation layer and the dielectric layer, selective to each said spacer, between the pair of gate stacks;
   forming an electrically conductive fill layer over and between the pair of gate stacks; and
   planarizing the fill layer to form said self-aligned contact plug that is:
      in contact with each said spacer on each said gate stack; and
      in contact with and electrically isolated above the semiconductor substrate.

17. The method as defined in claim 16, wherein planarizing the electrically conductive fill layer is a chemical mechanical polishing process.

18. The method as defined in claim 16, wherein exposing the semiconductor substrate between the pair of gate stacks is an anisotropic etch process.

19. The method as defined in claim 16, wherein:
   the electrical insulation layer and the dielectric layer are both composed of a first dielectric material;
   each said spacer is composed of a second dielectric material; and
   the first dielectric material is different than the second dielectric material.

20. The method as defined in claim 16, wherein:
   exposing the semiconductor substrate further comprises forming a portion of the dielectric layer that is upon each said spacer;
   forming the electrically conductive fill layer further comprises forming said electrically conductive fill layer upon the portion of the dielectric layer that is upon each said spacer, and
   planarizing the fill layer to form said self-aligned contact plug further comprises forming a planar top surface upon the portion of the dielectric layer that is upon each said spacer, said planar top surface being co-planar with a top surface on the self-aligned contact plug.

21. The method as defined in claim 16, wherein removing each said facet further comprises forming a planar top surface on each said gate stack that intersects and is perpendicular to a lateral surface on each said respective spacer.

22. The method as defined in claim 16, further comprising, prior to removing the removable material, selective to each said spacer:

forming a layer of a masking material over the dielectric layer; and forming a portion of the layer of the masking material that is vertically aligned with each said gate stack.

23. The method as defined in claim 16, wherein exposing each said facet by removing the electrical insulation layer further comprises exposing a surface on each said facet that is between an upper surface on each said spacer and the lowest extent of each said facet.

24. The method as defined in claim 16, wherein each said spacer is composed of a dielectric material and has an upper surface intersecting opposing facets, each said facet intersecting a lateral surface on the gate stack, each said lateral surface projecting towards the semiconductor substrate.

25. In an integrated circuit having a pair of gate stacks on a semiconductor substrate, the pair of gate stacks having thereover and therebetween a first layer of a removable material, each said gate stack including a spacer above the semiconductor substrate that encloses the gate stack, each said spacer having an upper surface intersecting opposing facets, each said facet intersecting a lateral surface on the gate stack, each said lateral surface projecting towards the semiconductor substrate, a method of forming a self-aligned contact plug, the method comprising:

planarizing the first layer of the removable material to expose the upper surface of each said spacer;

removing the first layer of the removable material to expose each said facet;

planarizing the pair of gate stacks and the first layer of the removable material to remove each said facet;

forming a second layer of the removable material upon the pair of gate stacks and the first layer of the removable material;

removing the removable material, selective to each said spacer, between the pair of gate stacks to expose the semiconductor substrate and to form a portion of the second layer of the removable material upon the upper surface of each said spacer;

forming an electrically conductive fill layer:

upon the portion of the second layer of the removable material upon the upper surface of each said spacer; and over and between the pair of gate stacks; and planarizing the fill layer to expose the upper surface of each said spacer and to form said self-aligned contact plug that is in contact with both the semiconductor substrate and each said spacer on each said gate stack.

26. The method as defined in claim 25, wherein a chemical mechanical planarization is performed in a process selected from the group consisting of:

planarizing the first layer of the removable material to expose the upper surface of each said spacer;

planarizing the pair of gate stacks and the first layer of the removable material to remove each said facet; and planarizing the fill layer to expose the upper surface of each said spacer.

27. The method as defined in claim 25, wherein removing the removable material, selective to each said spacer, between the pair of gate stacks to expose the semiconductor substrate is an anisotropic etch process.

28. The method as defined in claim 25, wherein:

the removable material is composed of a first dielectric material;

each said spacer is composed of a second dielectric material; and the first dielectric material is different than the second dielectric material.

29. The method as defined in claim 25, wherein planarizing the pair of gate stacks and the first layer of the removable material to remove each said facet forms a planar top surface on each said gate stack that intersects and is perpendicular to each said lateral surface.

30. The method as defined in claim 25, further comprising, prior to removing the removable material, selective to each said spacer:

forming a layer of a masking material over the second layer of the removable material; and forming a portion of the layer of the masking material that is vertically aligned with each said gate stack.

31. The method as defined in claim 25, wherein said exposed surface on each said facet is between the upper surface of each said spacer and the lowest extent of each said facet.

* * * * *

UNITED STATES PATENT AND TRADEMARK OFFICE
CERTIFICATE OF CORRECTION

PATENT NO.    : 6,420,259 B1
DATED         : July 16, 2002
INVENTOR(S)   : Bradley J. Howard It is certified that error appears in the above-identified patent and that said Letters Patent is hereby corrected as shown below:

<u>Title page,</u>
Item [56], U.S. PATENT DOCUMENTS, change "4,944,682" to -- 4,844,682 --

<u>Column 3,</u>
Line 32, after "thereof" insert a period

Signed and Sealed this

Fourth Day of March, 2003

JAMES E. ROGAN
*Director of the United States Patent and Trademark Office*